United States Patent [19]

Kashiwaba

[11] Patent Number: 5,408,286

[45] Date of Patent: Apr. 18, 1995

[54] SIGNAL GENERATING DEVICE WITH SELECTIVE PATTERN READING

[75] Inventor: Seiichi Kashiwaba, Tokyo, Japan

[73] Assignee: Canon Kabushiki Kaisha, Tokyo, Japan

[21] Appl. No.: 261,020

[22] Filed: Jun. 16, 1994

Related U.S. Application Data

[63] Continuation of Ser. No. 910,237, Jul. 9, 1992, abandoned.

[30] Foreign Application Priority Data

Jul. 11, 1991 [JP] Japan ................... 3-171188

[51] Int. Cl.⁶ .................... G03B 1/18; H03M 1/22
[52] U.S. Cl. ...................... 354/195.1; 341/3; 341/9; 341/16
[58] Field of Search ............. 341/3, 9, 10, 15, 16, 341/17; 354/195.1, 286

[56] References Cited

U.S. PATENT DOCUMENTS

| | | | |
|---|---|---|---|
| 3,188,407 | 6/1965 | Avgerinos | 341/9 |
| 3,204,236 | 8/1965 | Duris et al. | 341/3 |
| 3,781,866 | 12/1973 | Kilby | 341/9 |
| 4,122,000 | 7/1980 | Yamada | 341/16 |
| 4,443,788 | 4/1984 | Breslow | 341/3 |
| 4,949,087 | 8/1990 | Miyazawa | 341/16 |
| 5,327,184 | 7/1994 | Nomura | 354/195.1 |

*Primary Examiner*—Howard L. Williams
*Attorney, Agent, or Firm*—Fitzpatrick, Cella, Harper & Scinto

[57] ABSTRACT

A signal generating device has a pattern carrying unit with separated or connected patterns. Contact members of a signal reader make contact with the patterns and one of the patterns is selected for reading by a selector.

19 Claims, 5 Drawing Sheets

SIGNAL GENERATING DEVICE WITH SELECTIVE PATTERN READING

This application is a continuation of application Ser. No. 07/910,237, filed Jul. 9, 1992, now abandoned.

BACKGROUND OF THE INVENTION

1. Field of the Invention

The present invention relates to a signal generating device, and more particularly, to a signal generating device for selectively generating a plurality of different signals.

2. Description of the Related Art

Various types of devices are known that produce a digital signal by reading a gray code pattern portion provided on a code plate by means of a reading member. For example, a brush provides positional information on an object.

FIG. 5 is a schematic view of a conventional signal generating device which includes a brush and a code plate having a gray code pattern portion consisting of a plurality of patterns.

In FIG. 5, patterns P0, P1 and PC of a conductive substance, each of which generates a bit signal, are formed on a code plate 1 to form a gray code pattern portion. Reading of the gray code pattern portion is conducted to obtain bit signals by moving a brush 2 within a range from a position A to a position E in a state where it is in contact with the gray code pattern portion. The code plate 1 may be made movable, whereas the brush is fixed.

In the aforementioned structure, reading of the gray code pattern portion is changed over at points B, C and D. That is, the entire gray code pattern portion is divided into four regions I to IV.

The obtained bit signals are transferred to another printed circuit board (not shown) through a connecting terminal portion 1a. Thereafter, they may be input to operation means, such as a microcomputer, and used for various controls.

The above-mentioned conventional device has only one combination of the change-over points (hereinafter referred to as dividing positions). Application of such a signal generating device to, for example, detection of a focal length or a distance to an object in a single-lens reflex camera causes the following problems.

First, each type of single-lens reflex camera requires divided portions different from those required by the other types to detect the focal length or the distance to an object. Thus, it is difficult to employ a common code plate in various types of cameras, and one type of camera having a code plate with a gray code pattern portion different from those of other camera types must be provided. However, provision of a different code plate for each camera type increases production cost, particularly with regard to the type of camera which is manufactured only in small numbers at one time.

Secondly, a common code plate may be prepared by increasing the number of bits or increasing the divided regions. However, this increases the number of input pins of a microcomputer which inputs signals from the signal generating device and processes them, and requires a microcomputer having greater complexity. Hence, a large size microcomputer is necessary, which is disadvantageous in terms of production cost and installation space.

SUMMARY OF THE INVENTION

The invention is directed to a signal generating device having a plurality of patterns and a signal reader that contacts the patterns. A selector enables reading of one of the patterns.

A primary object of the present invention is to provide a signal generating device which can be employed for a plurality of applications.

A second object of the present invention is to provide a signal generating device which can generate a plurality of types of positional signals by a simple adjustment of a component.

A third object of the present invention is to provide a signal generating device which includes signal generation means having a signal generating pattern and a signal reading member for reading the signal generating pattern and in which at least one of the plurality of patterns constituting the signal generation pattern can selectively be read.

Other objects of the present invention will become apparent from the following description taken in connection with the accompanying drawings.

DETAILED DESCRIPTION OF THE PREFERRED EMBODIMENTS

Figure 1:
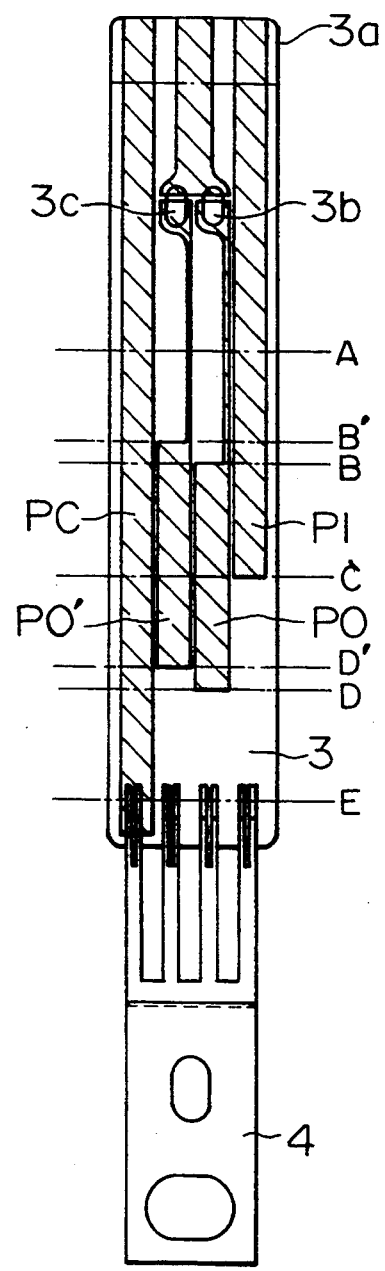
FIG. 1 is a plan view of a first embodiment of the present invention.

FIG. 1 illustrates a first embodiment of the present invention.

In FIG. 1, a plurality of patterns P0, P0', P1 and PC are formed on a portion of a code plate 3 to form a gray code pattern.

The patterns P0 and P0' represent the bits in the same place which constitutes the gray code pattern.

A connecting terminal portion 3a is connected to another printed circuit board to output bit signals. The bit signal output from the connecting terminal portion 3a among the bit signals of the patterns P0 and P0' is selected by short-circuiting either a pattern short-circuiting land 3b or a pattern short-circuiting land 3c by soldering or the like.

A brush 4 can slide on the patterns P0, P0', P1 and PC within a range from a position A to a position E, whereby bit signals are produced. If, for example, the pattern short-circuit land 3b is short-circuited, bit signals of a combination of patterns P0. P1 and PC are obtained and the dividing positions are positions B, C and D. If the pattern short-circuit land 3c is short-circuited, dividing positions B', C and D' are obtained from patterns P0', P1 and PC.

In this embodiment, a plurality of types of patterns are provided for the bits in the same place, constituting the gray code pattern, and any of these patterns is selectively connected to an output pattern. It is therefore possible to output a plurality of types of signals.

Figure 2:
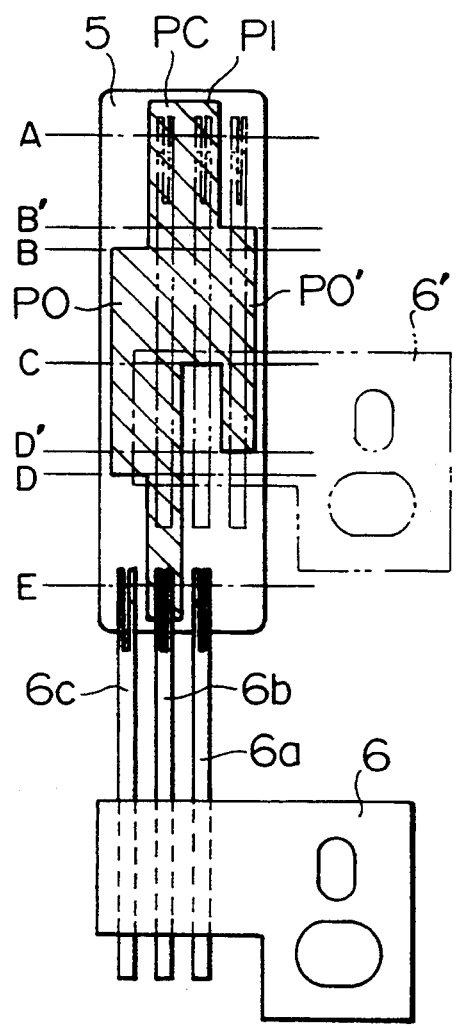
FIG. 2 is a plan view of a second embodiment of the present invention.

FIG. 2 illustrates a second embodiment of the present invention.

In FIG. 2, patterns P0, P0', P1 and PC, constituting the gray code pattern, are formed on a code plate 5 in such a manner that they are connected to each other. Patterns P0 and P0' represent alternative bits in the same bit position of a code where P1 represents a different bit position of the code. As a result, two different signals may be obtained by selecting the P0 or P0' pattern or track for one bit and combining the selected pattern or track with the P1 pattern or track for the different bit.

Contact pieces 6a, 6b and 6c of a brush 6 are retained such that they are in contact with patterns P0, P1 and PC, respectively, in a state where they are electrically insulated from each other so as to output bit signals.

In the structure shown in FIG. 2, as the brush 6 moves within the range from position A to position E, bit signals are changed over at dividing positions B, C and D. If the code plate 5 and the brush 6 are mounted in a state indicated by reference numeral 6' such that the contact pieces 6a, 6b and 6c of the brush 6 are in contact with the patterns P0', P1 and PC, respectively, dividing positions B, C and D change to dividing positions B', C and D'.

Figure 3:
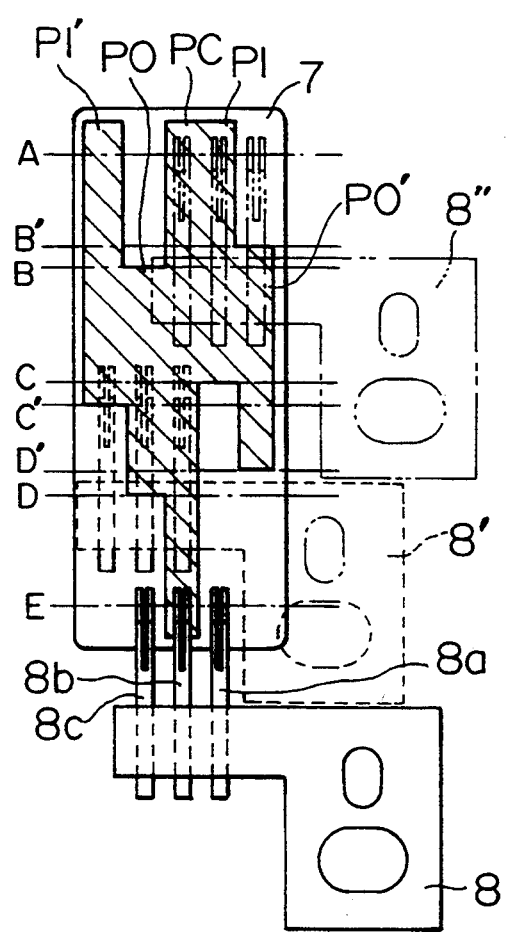
FIG. 3 is a plan view of a third embodiment of the present invention.

FIG. 3 illustrates a third embodiment of the present invention. In FIG. 3, three combinations of dividing positions can be output.

As shown in FIG. 3, patterns P0, P0', P1, P1' and PC, constituting a gray code pattern, are provided on a code plate 7 in such a manner that they are connected to each other. Patterns P0 and P0' represent bits in the same place and patterns P1 and P1' represent bits in the same place.

Contact pieces 8a, 8b and 8c of a brush 8 are retained such that they are in contact with the patterns P0, P1 and PC, respectively, in a state where they are electrically insulated from each other to output bit signals.

In the structure shown in FIG. 3, as the brush 8 moves within the range from position A to position E, the bit signals are changed over at dividing positions B, C and D. When the code plate 7 and the brush 8 are mounted in a state (indicated by reference numeral 8') where the contact pieces 8a, 8b and 8c of the brush 8 are in contact with patterns P0, P1' and PC, respectively or in a state (indicated by reference numeral 8") where the contact pieces 8a, 8b and 8c are in contact with patterns P0', P1 and PC, respectively, the dividing positions change to B, C' and D or B', C and D'.

As mentioned above, in the second and third embodiments, one of a plurality of patterns for the bits in the same plate can be selected by changing the relative mounting position of the code plate and brush.

Figure 4A:
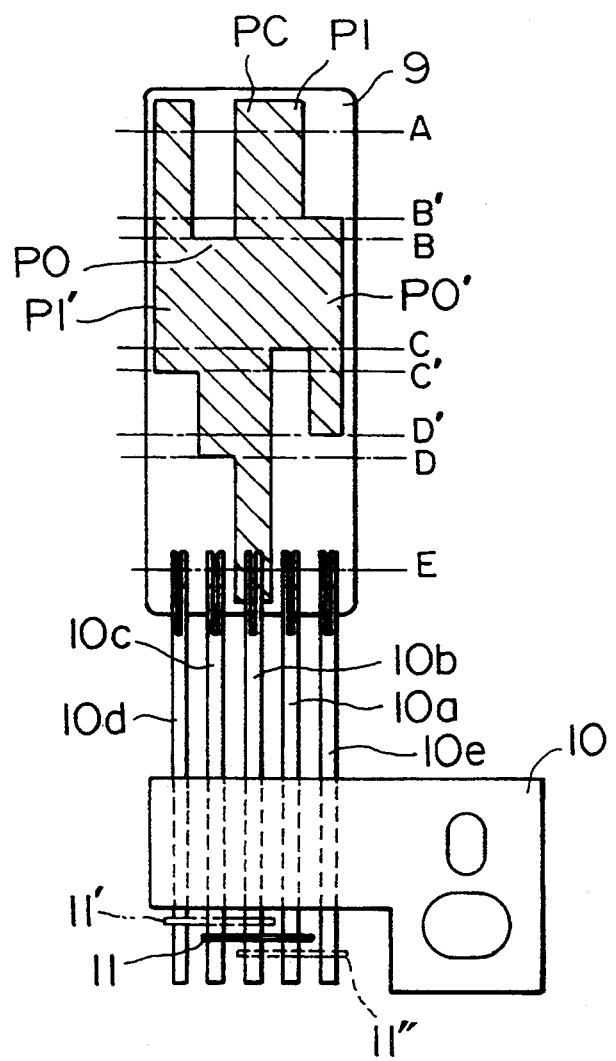
FIGS. 4A and 4B show a plan view of a fourth embodiment of the present invention.
Figure 4B:
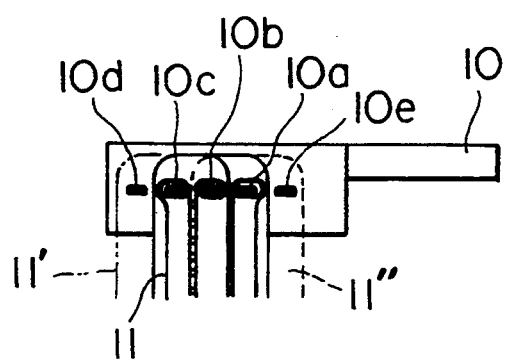
Figure 5:
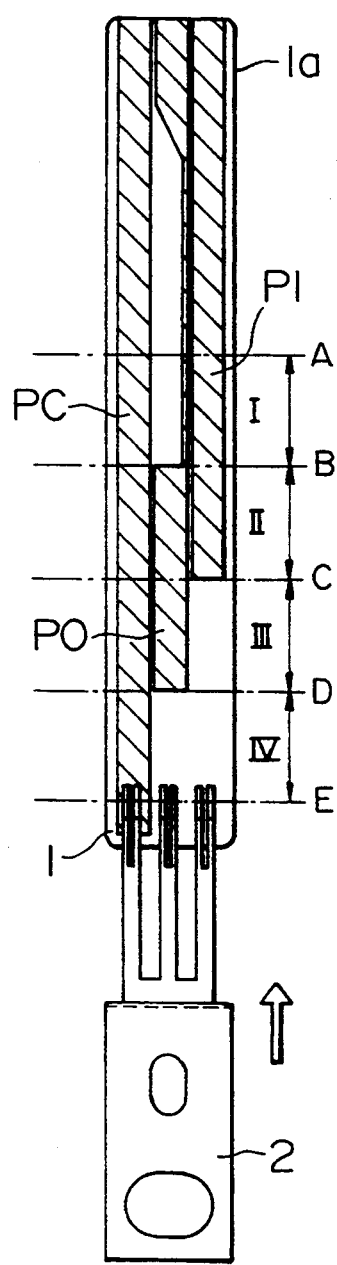
FIG. 5 is a plan view of a conventional technique.

FIGS. 4A and 4B illustrates a fourth embodiment of the present invention.

In FIG. 4A, patterns P0, P0', P1, P1' and PC, constituting the gray code pattern, are formed on a code plate 9 in a state where they are connected to each other. Patterns P0 and P0' and patterns P1 and P1' represent the bits in the same place, respectively.

Contact pieces 10a, 10b, 10c, 10d and 10e are retained on a brush 10 such that they are in contact with patterns P0, P0', P1, P1' and PC, respectively, in a state where they are electrically insulated from each other.

A printed circuit board 11 is in contact with each of the contact pieces 10a, 10b and 10c of the brush 10 to output bit signals from these contact pieces.

In the structure shown in FIGS. 4A and 4B, as the brush 10 moves within the range from position A to position E, the bit signals are changed over at dividing positions B, C and D. When the connected position of the printed circuit board 11 is changed in such a manner that the bit signals are output from the contacts 10b, 10c and 10d (which is indicated by reference numeral 11') or in such a manner that the bit signals are output from the contacts 10a, 10b and 10e (which is indicated by reference numeral 11"), the dividing positions change to B, C' and D or B', C, and D'.

Thus, in the fourth embodiment, since the connected positions of the printed circuit board for transmitting the output can be selected, a plurality of different signals can be output.

In the aforementioned embodiments, a 2-bit signal generating device capable of generating two or three types of signals has been described. However, the present invention is not limited to those and the techniques of the individual embodiments may be combined.

As will be understood from the foregoing description, in the signal generation means having a signal generation pattern and a signal reading member for reading the signal generation pattern, since at least one of a plurality of patterns constituting the signal generation pattern can be selectively read, a plurality of different signals can be generated. Consequently, a common signal generation device can be employed in a plurality of different types of cameras without increasing the number of bits, and production cost is not increased.

What is claimed is:

1. A signal generating device comprising:
   track carrying means for carrying a plurality of tracks;
   signal reading means having contact members which make contact with the tracks, respectively; and
   selection means for selectively reading one track of plural tracks representing the same bit position in the plurality of tracks.

2. The signal generating device according to claim 1, wherein said selection means selectively connects a track of the plurality of tracks to an output terminal.

3. The signal generating device according to claim 1, wherein said tracks are interconnected with each other and said selection means changes over contact between tracks which make contact in a first mode and the contact members, and contact between tracks which make contact in a second mode and the contact members.

4. The signal generating device according to claim 1, wherein said selection means selects the contact member from which an output signal is taken from among the contact members.

5. A signal generating device comprising:
   a track carrying member for carrying a plurality of separated tracks;
   a signal reading member having contact members which make contact with the tracks, respectively; and
   a selection member for selectively connecting one of the plurality of separated tracks to an output terminal.

6. A signal generating device comprising:
   a track carrying member for carrying a plurality of connected tracks; and
   a signal reading member for making contact with the connected tracks, said signal reading member having fewer contact members than the number of tracks, and said signal reading member being able to be displaced in a direction which crosses a direction of extension of the tracks, wherein at least one contact member selectively connects with one of a group of tracks in the plurality of tracks, the group of tracks representing bits of the same bit position.

7. A signal generating device comprising:
a track carrying member for carrying a plurality of connected tracks;
a signal reading member having contact members which make contact with the tracks, respectively; and
a connecting member having fewer output terminals than the number of tracks, said connecting member connecting the output terminals to the contact members.

8. A signal generating device comprising:
track carrying means for carrying a plurality of separated tracks;
signal reading means having contact members which make contact with the tracks, respectively; and
selection means which enables at least one of the plurality of tracks to be selectively read.

9. A device according to any one of claims 2, 5 or 8, wherein said selection means comprises solder.

10. A camera comprising:
A signal generating device that includes:
track carrying means for carrying a plurality of tracks;
signal reading means having contact members which make contact with the tracks, respectively; and
selection means for selectively reading one track of plural tracks representing the same bit position in the plurality of tracks.

11. A camera comprising:
A signal generating device that includes:
track carrying means for carrying a plurality of tracks;
signal reading means having contact members which make contact with the tracks, respectively; and
selection means for selectively reading one track of plural tracks representing the same bit position in the plurality of tracks,
wherein said tracks are interconnected with each other and said selection means changes over contact between tracks which make contact in a first mode and the contact members, and contact between tracks which make contact in a second mode and the contact members.

12. A camera comprising:
a signal generating device that includes:
track carrying means for carrying a plurality of tracks;
signal reading means having contact members which make contact with the tracks, respectively; and
selection means for selectively reading one track of plural tracks representing the same bit position in the plurality of tracks,
wherein said selection means selects the contact member from which an output signal is taken from among the contact members.

13. A camera comprising:
a signal generating device that includes:
a track carrying member for carrying a plurality of separated tracks;
a signal reading member having contact members which make contact with the tracks, respectively; and
a selection member for selectively connecting one of the plurality of separated tracks to an output terminal.

14. A camera comprising:
a signal generating device which includes:
a track carrying member for carrying a plurality of connected tracks; and
a signal reading member for making contact with the connected tracks, said signal reading member having fewer contact members than the number of tracks, and said signal reading member being able to be displaced in a direction which crosses a direction of extension of the tracks,
wherein at least one contact member selectively connects with one of a group of tracks in the plurality of tracks, the group of tracks representing bits of the same bit position.

15. A camera comprising:
a signal generating device which includes:
a track carrying member for carrying a plurality of connected tracks;
a signal reading member having contact members which make contact with the tracks, respectively; and
a connecting member having fewer output terminals than the number of tracks, said connecting member connecting the output terminals to the contact members.

16. A camera comprising:
A signal generating device which includes:
track carrying means for carrying a plurality of separated tracks;
signal reading means having contact members which make contact with the tracks, respectively; and
selecting means which enables at least one of the plurality of tracks to be selectively read.

17. A camera according to any one of claims 10, 11, 12, 13, 14, 15 or 16 wherein said camera is a single reflex camera.

18. A camera according to any one of claims 10, 11, 12, 13, 14, 15 or 16 wherein said signal generating device generates an information signal with respect to focal length.

19. A camera according to any one of claims 10, 11, 12, 13, 14, 15 or 16 wherein said signal generating device generates an information signal with respect to an object distance.

* * * * *